(12) United States Patent
Esmaeili

(10) Patent No.: US 9,729,144 B2
(45) Date of Patent: Aug. 8, 2017

(54) ISOLATED UNI-POLAR TRANSISTOR GATE DRIVE

(71) Applicant: SCHNEIDER ELECTRIC SOLAR INVERTERS USA, INC., Livermore, CA (US)

(72) Inventor: Morteza Esmaeili, Coquitlam (CA)

(73) Assignee: SCHNEIDER ELECTRIC SOLAR INVERTERS USA, INC., Livermore, CA (US)

( * ) Notice: Subject to any disclaimer, the term of this patent is extended or adjusted under 35 U.S.C. 154(b) by 0 days.

(21) Appl. No.: 14/908,735

(22) PCT Filed: Jul. 31, 2013

(86) PCT No.: PCT/US2013/052965
§ 371 (c)(1),
(2) Date: Jan. 29, 2016

(87) PCT Pub. No.: WO2015/016891
PCT Pub. Date: Feb. 5, 2015

(65) Prior Publication Data
US 2016/0191053 A1 Jun. 30, 2016

(51) Int. Cl.
*H03K 3/00* (2006.01)
*H03K 17/691* (2006.01)
(Continued)

(52) U.S. Cl.
CPC ............ *H03K 17/691* (2013.01); *H03K 7/08* (2013.01); *H03K 17/567* (2013.01); *H03K 17/61* (2013.01); *H03K 17/6877* (2013.01)

(58) Field of Classification Search
None
See application file for complete search history.

(56) References Cited

U.S. PATENT DOCUMENTS

| 4,758,941 A | * | 7/1988 | Felton | ................. H02M 7/5387 327/436 |
| 5,019,719 A | * | 5/1991 | King | ....................... H03K 5/12 327/108 |

(Continued)

FOREIGN PATENT DOCUMENTS

WO 90/13178 A1 11/1990

OTHER PUBLICATIONS

Mally. Gate Drive Transformer Circuit Maintains Fast Turn-Off Time. 2011. [retrieved on Jan. 2, 2014]. Retrieved from the Internet: <URL: http://electronicdesign.com/energy/gate-drive-transformer-circuit-maintains-fast-turn-time>.

(Continued)

*Primary Examiner* — Lincoln Donovan
*Assistant Examiner* — Khareem E Almo
(74) *Attorney, Agent, or Firm* — Lando & Anastasi, LLP

(57) ABSTRACT

According to one aspect, a transistor gate drive comprises a first input configured to be coupled to a DC voltage source, a second input configured to receive a control signal, a third input configured to couple to a ground connection, a transformer, a first switch configured to couple the first input to a first end of a primary winding of the transformer in response to receipt of the control signal, and to decouple the first input from the first end of the primary winding in response to the receipt of the control signal, a second switch configured to couple a second end of the primary winding to the third input in response to receipt of the control signal, and to decouple the second end of the primary winding from the third input in response to the receipt of the control signal.

16 Claims, 2 Drawing Sheets

(51) Int. Cl.
*H03K 17/61* (2006.01)
*H03K 7/08* (2006.01)
*H03K 17/567* (2006.01)
*H03K 17/687* (2006.01)

(56) References Cited

U.S. PATENT DOCUMENTS

| | | | | |
|---|---|---|---|---|
| 5,786,687 | A * | 7/1998 | Faulk | H02M 3/155 |
| | | | | 323/289 |
| 6,252,787 | B1 * | 6/2001 | Zappacosta, II | H02M 3/28 |
| | | | | 363/21.04 |
| 6,324,077 | B1 | 11/2001 | Lopresti et al. | |
| 6,822,882 | B1 * | 11/2004 | Jacobs | H02M 3/33592 |
| | | | | 363/21.06 |
| 8,680,837 | B2 * | 3/2014 | Zeng | H03K 17/6877 |
| | | | | 323/289 |
| 9,257,248 | B2 * | 2/2016 | Mochikawa | H01H 47/00 |
| 9,444,351 | B2 * | 9/2016 | Morita | H02M 1/08 |
| 2010/0277090 | A1 * | 11/2010 | Fukumoto | H02M 7/53871 |
| | | | | 315/291 |
| 2011/0221482 | A1 * | 9/2011 | Kim | H03K 17/6871 |
| | | | | 327/109 |
| 2012/0008344 | A1 | 1/2012 | Zeng et al. | |
| 2012/0133420 | A1 * | 5/2012 | Draxelmayr | H02M 3/337 |
| | | | | 327/430 |
| 2015/0042384 | A1 * | 2/2015 | Voss | H01L 25/072 |
| | | | | 327/109 |
| 2015/0054549 | A1 * | 2/2015 | Lin | G01R 19/2509 |
| | | | | 327/33 |
| 2015/0117063 | A1 * | 4/2015 | Rivet | H02M 1/08 |
| | | | | 363/17 |
| 2015/0124507 | A1 * | 5/2015 | Ridder | H03K 17/04123 |
| | | | | 363/127 |
| 2015/0130516 | A1 * | 5/2015 | Asai | H02M 3/33561 |
| | | | | 327/109 |
| 2016/0173083 | A1 * | 6/2016 | Alexander | H02M 7/219 |
| | | | | 327/425 |
| 2016/0191053 | A1 * | 6/2016 | Esmaeili | H03K 17/61 |
| | | | | 327/109 |
| 2016/0226479 | A1 * | 8/2016 | Xu | H03K 17/56 |
| 2016/0241234 | A1 * | 8/2016 | Mavretic | G01R 19/165 |

OTHER PUBLICATIONS

Notification of Transmittal of the International Search Report and Written Opinon of the International Searching Authority from corresponding PCT/US2013/052965 dated Jan. 17, 2014.
Extended European Search Report from corresponding European Application No. 13890436.2 dated Mar. 16, 2017.
Supplementary European Search Report from corresponding European Application No. 13890436.2 dated Apr. 4, 2017.

* cited by examiner

ISOLATED UNI-POLAR TRANSISTOR GATE DRIVE

CROSS-REFERENCE TO RELATED APPLICATIONS

This application is a U.S. National Stage Application under 35 U.S.C. §371 of International Application No. PCT/US2013/052965, filed Jul. 31, 2013, titled ISOLATED UNIPOLAR TRANSISTOR GATE DRIVE, which is hereby incorporated herein by reference in its entirety.

BACKGROUND OF INVENTION

1. Field of Invention

At least some embodiments described herein relate generally to high-speed isolated transistor gate drives, and more particularly to the coupling of electronic pulses between two isolated circuits in such applications.

2. Discussion of Related Art

In various applications it may be advantageous to isolate high side switches in off-line circuits or similar high voltage circuits. For example, a common isolated transistor gate drive circuit includes a transformer to provide galvanic isolation between an input of the gate drive circuit and an output of the gate drive circuit. A primary winding of the transformer is coupled to an input side of the circuit and a secondary winding of the transformer is coupled to an output side of the circuit providing isolation between the input and the output. One or more additional primary and secondary windings may be included in the transformer and may drive a number of additional output side switching circuits.

SUMMARY OF INVENTION

At least one aspect of the invention is directed to a transistor gate drive. The transistor gate drive comprises a first input configured to be coupled to a DC voltage source, a second input configured to receive a control signal, a third input configured to couple to a ground connection, a transformer having a primary winding and at least one secondary winding, the primary winding having a first end and a second end, a first switch having a control input and configured to couple the first input to the first end of the primary winding in response to receipt of the control signal having a first level, and to decouple the first input from the first end of the primary winding in response to the receipt of the control signal having a second level, a second switch having a control input and configured to couple the second side of the primary winding to the third input in response to receipt of the control signal having the first level, and to decouple the second side of the primary winding from the third input in response to the receipt of the control signal having the second level, a first diode coupled between the first switch and the first end of the primary winding and further coupled to the third input, and a second diode coupled to the first input and further coupled between the second switch and the second end of the primary winding.

According to one embodiment, the first diode and the second diode are configured to provide a path for a reset of the primary winding. In another embodiment, the first switch includes a control pin coupled to the second input, a collector coupled to the first input, and an emitter coupled between the first diode and the primary winding of the transformer. In still another embodiment, the second switch is a MOSFET having a drain coupled between the primary winding and the second diode and a source coupled to the third input.

According to another embodiment, the primary winding and the secondary winding have a same polarity. In this embodiment, the transistor gate drive further comprises at least one secondary circuit coupled to the at least one secondary winding of the transformer and having an output configured to drive a control pin of a transistor based on a level of the control signal. In addition, the at least one secondary circuit may comprise a turn-off switch, and a turn-on diode, wherein the turn-off switch and the turn-on diode are coupled in parallel with the at least one secondary winding of the transformer, and wherein a junction point between the turn-on diode and the turn-off switch are coupled to the output of the at least one secondary circuit. Further, the at least one secondary circuit may comprise a pull-down resistor coupled between the output of the at least one secondary circuit and an output ground connection.

In another embodiment, the PWM controller may be coupled to the first switch and the second switch, and the PWM controller may be configured to generate the control signal. In this embodiment, the PWM controller may be configured to generate a control signal having a duty cycle of 50% or less. In addition, the duty cycle may be a variable duty cycle based on input signal provided to the PWM controller.

Another aspect of the invention is directed to a method of operating a transistor gate drive circuit. The method comprises receiving a DC input voltage at a first input of the transistor gate drive circuit, receiving, in a turn-on mode, a control signal at a second input of the transistor gate drive circuit, the control signal having a first level, coupling, responsive to receipt of the control signal having the first level, the first input to a first end of a primary winding of a transformer, coupling, responsive to receipt of the control signal having the first level, a second end of the primary winding of the transformer to a ground connection, receiving, in a turn-off mode, the control signal at the second input of the transistor gate drive circuit, the control signal having a second level, and discharging, in response to the receipt of the control signal having the second level, the transformer.

According to one embodiment, the method further comprises inducing, in the turn-on mode, a current in at least one secondary winding of the transformer; and using the current, driving at least one primary switch of at least one output circuit to turn on.

According to another embodiment, the method further comprises decoupling, responsive to receipt of the control signal having the second level, the first input from the first end of the primary winding of the transformer, decoupling, responsive to receipt of the control signal having the second level, the second end of the primary winding of the transformer from the ground connection, and resetting the primary winding of the transformer through a first diode and a second diode.

According to one embodiment, resetting includes limiting a voltage across the first switch and the second switch.

According to another embodiment, the method further comprises driving, in response to resetting the primary winding, a turn-off switch to turn on, and coupling, in response to the turn-off switch turning on, a control pin of at least one primary switch of at least one output circuit to a second ground connection, and driving the at least one primary switch to turn off.

According to one embodiment, receiving further includes receiving the control signal from a pulse-width modulation (PWM) controller, the control signal having a duty cycle. In this embodiment, the method further comprises changing the duty cycle of the control signal from a first duty to a second duty cycle.

Still another aspect of this invention is directed to a transistor gate drive circuit. The gate drive circuit comprises a first input configured to be coupled to a DC voltage source, a second input configured to receive a control signal, a third input configured to couple to a ground connection, a transformer, the transformer having a primary winding and at least one secondary winding, and means for inducing a current on the secondary winding, in a turn-on mode of operation, by coupling the primary winding of the transformer to the first input and the ground connection creating a first current path that includes the primary winding of the transformer, and in a turn-off mode of operation, resetting the primary winding of the transformer through a second current path, wherein neither the first current path nor the second current path includes a capacitor.

In one embodiment, the transistor gate further comprises means for limiting voltage across the first switch and the second switch during the turn-off mode.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
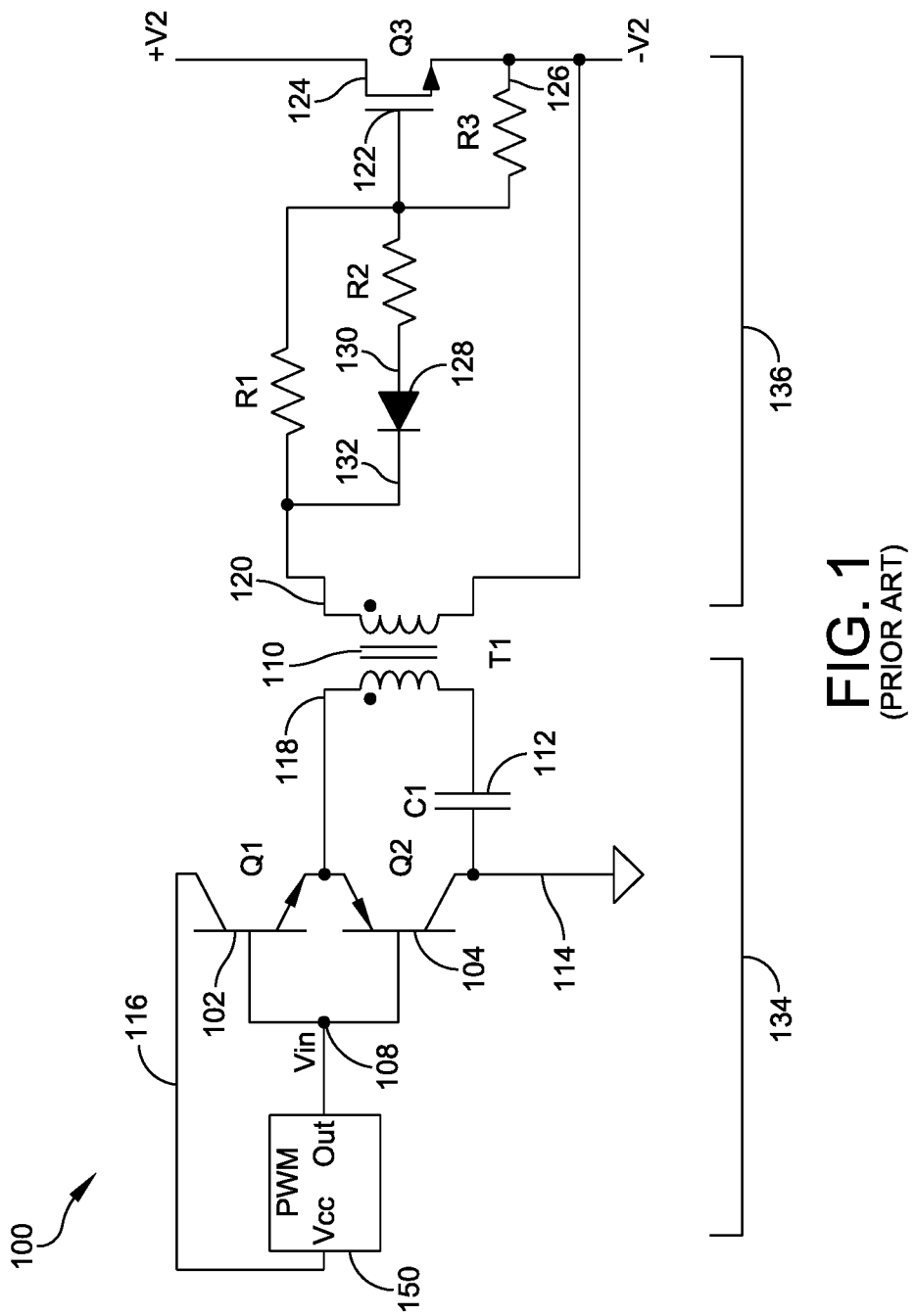
FIG. 1 is a schematic diagram of a transistor gate drive according to one approach.

Various embodiments and aspects thereof will now be discussed in detail with reference to the accompanying drawings. It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, a typical isolated transistor gate drive circuit includes a transformer coupled between an input side and an output side to provide isolation. FIG. 1 shows one prior approach to an isolated transistor gate drive 100. This approach may be used in conjunction with a pulse width modulation (PWM) current controller to drive a high side switch. The isolated transistor gate drive 100 will couple an AC signal from an input side 134 to an output side 136 through a transformer 110. The transistor gate drive 100 operates on a theoretical maximum duty cycle of 50%. This insures that over any given period of time the integral of the positive voltages plus the integral of the negative voltages will be zero across the transformer 110. As will be discussed below, the introduction of a DC component may cause saturation of the transformer 110. In addition, an asymmetrical pulse, or sudden change in duty cycle, may generate a shift in voltage level at the gate 122 of a primary switch 124. Therefore, in typical prior art circuits any voltage shift or DC component is blocked or filtered.

The isolated transistor gate drive 100 includes the input side 134, an input 108, a first switch 102, a second switch 104, a DC power source ($V_{DR}$) 116, a ground connection 114, a DC blocking capacitor 112, a primary winding 118, the transformer 110, the output side 136, a secondary winding 120, the primary switch 124, the gate 122, a pull-down resistor 126, a turn-off diode 128 and a PWM current controller 150.

The output of the PWM controller 150 is coupled to the input 108. The input 108 is coupled to the base of the first switch 102 and a base of the second switch 104. The collector of first switch 102 is coupled to the $V_{DR}$ 116. As shown in FIG. 1, the first switch 102 and the second switch 104 are arranged in a common bipolar, non-inverting totempole configuration. The intersection between the first switch 102 and the second switch 104 is coupled to the primary winding 118 of the transformer 110. An emitter of the second switch 104 is coupled to the ground connection 114 and also coupled to one end of the DC blocking capacitor 112. The other end of DC blocking capacitor 112 is coupled to the primary winding 118 of the transformer 110. The secondary winding 120 of the transformer 110 is coupled to a cathode 132 of the turn-off diode 128. An anode 130 of a diode 128 is coupled to the pull-down resistor 126 and to the gate 122 of the primary switch 124. Although one particular input side 134 switching circuit is shown in FIG. 1, various other prior approaches to isolated transistor gate drives are well known in the art. Likewise, although one particular output side 136 switching circuit is shown in FIG. 1, a number of additional output side switching circuits may be utilized and are well known in the art.

During the turn-on stage (e.g., a rising edge of a square wave from the PWM current controller 150), a voltage is applied to the input 108 driving the base of the first switch 102 and the second switch 104 high. The first switch 102 is a NPN type transistor which turns on and begins to conduct from emitter to collector when driven high. The second switch 104 is a PNP transistor that is turned off when driven high. Current from $V_{DR}$ 116 through the first switch 102, and the primary winding 118 of transformer 110, induces a positive current in the secondary winding 120 of the transformer 110. At the same time, the current through the primary winding 118 of the transformer 110 charges the DC blocking capacitor 112. The induced current in the secondary winding 120 of the transformer 110 causes the primary switch 124 to turn on.

During the turn-off stage (e.g., a falling edge of a square wave from the PWM current controller 150), the base of the first switch 102 and the base of the second switch 104 are driven low. As a result, the first switch 102 is turned off and the second switch 104 is turned on. The DC blocking capacitor 112 then provides a reset voltage to the primary winding 118 of the transformer 110. The transformer 112 then discharges inducing a negative current on the secondary winding 120. As a result, the turn-off diode 128 becomes forward-biased and begins to conduct, providing a path for the negative current to drive gate 122 of the primary switch 124 to a negative potential (low) causing the primary switch 124 to turn off.

The aforementioned approach accomplishes galvanic isolation of the input side 134 and the output side 136 through the coupled transformer 110 using the DC blocking capacitor 112 coupled to the primary winding 118 of the transformer 110. Without the DC blocking capacitor 112 in the circuit 100, a duty cycle dependent DC voltage will exist across the transformer 110, causing the transformer 110 to saturate over time. However, the inclusion of the DC blocking capacitor 112 limits the overall speed at which the primary winding 118 of the transformer 110 resets. Also, the inclusion of the DC blocking capacitor 112 necessitates that the duty cycle remain relatively constant. A sudden change in the duty cycle will cause a proportional shift in voltage supplied to the gate 122. In addition, sudden changes in the duty cycle may excite the resonant tank (or LC resonant tank) formed by the magnetizing inductance of the transformer 110 and the DC blocking capacitor 112 and adversely affect the shape of the output waveform.

At least some embodiments described herein provide a unipolar, isolated transistor gate drive circuit with protective clamp and reset circuit which eliminates the need for a DC blocking capacitor. According to some embodiments, the transistor gate drive circuit with protective clamp and reset circuit may operate on a pulse with a constant duty cycle of 50%. According to other embodiments, the transistor gate drive circuit with protective clamp and reset circuit may operate on a pulse with a variable duty cycle. In these embodiments, the duty cycle may change at any point and rate during the operation of the transistor gate drive circuit without adverse effect on the output waveform.

Figure 2:
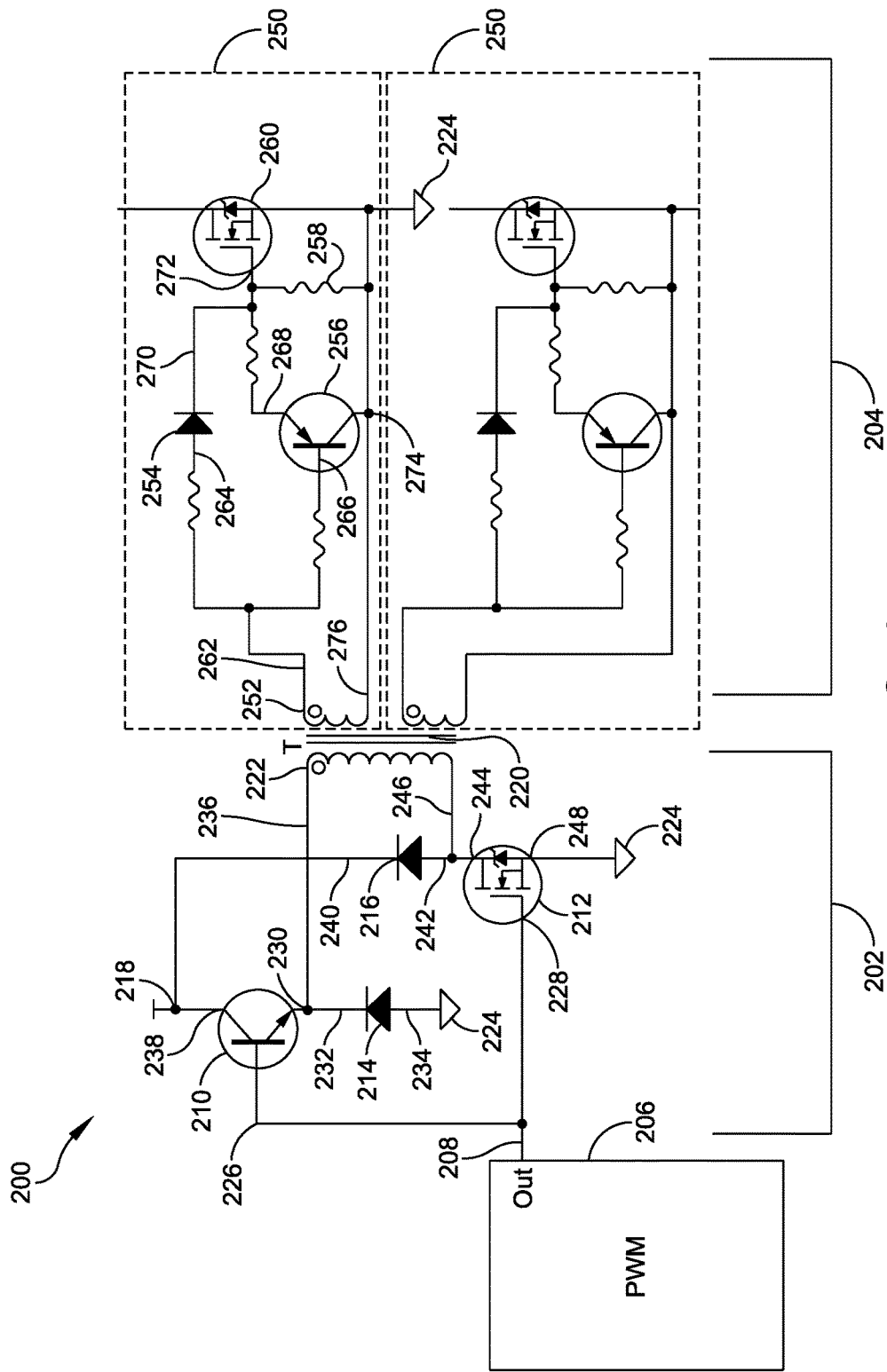
FIG. 2 is a schematic diagram of a unipolar, isolated transistor gate drive circuit according to one embodiment.

FIG. 2 is a block diagram of a unipolar, isolated transistor gate drive circuit with protective clamp and reset circuit 200 according to aspects described herein. According to one embodiment, the transistor gate drive circuit 200 is a transformer coupled gate drive with an input side 202 coupled to a transformer 220 to induce a current to drive an output side 204. The gate drive circuit 200 may include a PWM current controller 206, an input 208, a first switch 210, a second switch 212, a first diode 214, a second diode 216, a DC voltage ($V_{DRV}$) 218, the transformer 220, a primary winding 222, and a ground connection 224. It should be understood that the PWM current controller 206 may have a totem pole output (or buffer) similar to the totem pole configuration of 102 and 104 of FIG. 1.

The input 208 is configured to be coupled to the PWM current controller 206 and a base 226 of the first switch and a gate 228 of the second switch. As shown in FIG. 2, the PWM current controller 206 is a UC2845 current mode PWM controller; however, in other embodiments the PWM current controller may be a different type. According to one embodiment, the first switch 210 is a NPN transistor; however, in other embodiments a different type of switch may be used. Likewise, according to one embodiment the second switch 212 device is a MOSFET; however, in other embodiments a different type of switch may be used. An emitter 230 of the first switch 210 is coupled between a cathode 232 of the first diode 214 and a first end 236 of the primary winding 222 of the transformer 220. An anode 234 of the first diode 214 is coupled to the ground connection 224. A collector 238 of the first switch 210 is coupled between a cathode 240 of the second diode 216 and the $V_{DRV}$ 218. The anode 242 of the second diode 216 coupled to a drain 244 of the second switch 212. A drain 244 of the second switch 212 is coupled between the anode 242 of the second diode 216 and the second end 246 of the primary winding 222 of the transformer 220. A source 248 of the second switch 212 is coupled to the ground connection 224.

Still referring to FIG. 2, included is two output side switching circuits indicated at 250 coupled to the transformer 220 via secondary windings 252. It should be understood that the output side switching circuit 250 is not limited to the circuit shown in FIG. 2, as described further below, and may be configured in various alternative configurations which enable a gate on each output side switching circuit 250, or a plurality of gates on each output side switching circuit 250, to be driven via an induced current. According to one embodiment, each of the output side switching circuits 250 includes a turn-on diode 254, a turn-off switch 256, a pull down resistor 258 and a primary switch 260. In certain other embodiments, only one output side switching circuit 250, with a single gate 272, may be coupled to a transformer 220 via secondary windings.

According to one embodiment, a first end 262 of the secondary winding 252 is coupled to an anode 264 of the turn-on diode 254. The first end 262 of the secondary winding 252 is also coupled to a base 266 of the turn-off switch 256. A collector 268 of the turn-off switch 256 is coupled between a cathode 270 of the turn-on diode 254 and to the gate 272 of the primary switch 260. One side of the pull down resistor 258 is coupled between the gate 272 of the primary switch 260 and the first end 262 of the secondary winding 252. Another side of the pull down resistor 258 is coupled to the second side 276 of the secondary winding 252. The collector 274 of the turn-off switch 256 is coupled to a second side 276 of the secondary winding 252. The second end 276 of the secondary winding 252 may be coupled to the ground connection 224. In one embodiment, the ground connection 224 of the output side 204 is isolated from the ground connection 224 of the input side 202. In other embodiments, the ground connection 224 may be common among the input side 202 and the output side 204.

As discussed above, although FIG. 2 shows one particular type of output side 204 circuit (i.e., one skilled in the art would recognize as a PNP turn-off circuit), it should be understood that any number of circuits may be utilized including the output side 136 (FIG. 1) discussed above. The output side 204 circuit may have one or more gates (or control pins) which are driven by the input side 202. For example, and not intended to be limiting, the output side switching circuit 250 is a NMOS turn-off circuit. In other examples, the switching circuit 250 may be comprised of other electronic switches such as a biopolar transistor, a MOSFET transistor, and an insulated-gate bipolar transistor (IGBT). Still further examples include electronic switches for positive and negative logic (e.g., PNP, NPN, Nmos, Pmos, and IGBT). According to one embodiment, there may be one output side switching circuit 250 coupled to the transformer 220 via secondary windings. In other embodiments there may be a plurality of output side switching circuits 250 coupled to the transformer 220 via secondary windings. It should be recognized that each output side switching circuit 250 may be identical to one another, or each may be a different circuit configuration.

In a turn-on mode of the transistor gate drive 200, a signal is applied (e.g., rising edge of a square wave from the PWM controller 206) to the input 208 for an interval of time. In one embodiment, the control signal is provided by the PWM current controller 206; however, in other embodiments, the control signal is provided by any other signal generator known in the art. As discussed above, the duty cycle of the control signal provided by the PWM current controller 206 may be constant, or variable. In this embodiment, a width of a pulse provided by the PWM current controller 206 determines the interval of time the transistor gate drive 200 operates in the turn-on mode. As shown in FIG. 2, the PWM current controller 206 supplies the control signal to the base 226 of the first switch 210 and the gate 228 of the second switch 212 to selectively couple voltage of $V_{DRV}$ 218 to the first side 236 of the primary winding 222 of the transformer 220. The current from the $V_{DRV}$ 218 induces a positive current in the secondary winding 252 at a level sufficient to drive the gate 272 of the primary switch 260 to change state (e.g., close).

When the PWM current controller 206 applies a control signal (e.g., a rising edge of a square wave from the PWM current controller 206), the first switch 210 and the second switch 212 are simultaneously turned on (e.g., driven high). As a result, a current from the $V_{DRV}$ 218 flows from the collector 238 of the first switch 210 to the emitter 230 of the first switch 210, providing the current to the first end 236 of the primary winding 222. As the current passes from the first end 236 to the second end 246 of the primary winding 222, current and magnetic flux in the primary winding 222 increases, resulting in energy being stored in the transformer 220. In one embodiment, the turns ratio of the transformer 220 is 1:1; however, in other embodiments, the turns ratio of the transformer 220 may be configured differently. In the embodiment shown, the primary winding 222 and the secondary winding 252 have the same polarity. Therefore, as the current and magnetic flux in the primary winding 222 increases, a positive current is induced in the first end 262 of the secondary winding 252. As a result, turn-on diode 254 becomes forward-biased providing a path for the positive current to the gate 272 of the primary switch 260. At the same time, the turn-off switch 256 is turned off. The current is then applied to the gate 272 of the primary switch 260, causing the primary switch 260 to change state (e.g., to close).

In a turn-off mode of the transistor gate drive 200, another control signal is applied (e.g., a falling edge of a square wave from the PWM current controller 206) at input 208, simultaneously driving the first switch 210 and the second switch 212 off (e.g., low). When the first switch 210 and the second switch 212 turn off, back electro motive force (EMF) in a reverse polarity (i.e., negative current) is formed across the primary winding 222. As a result, the first diode 214 and the second diode 216 become forward-biased and begin to conduct, supplying the negative current with a path from the ground connection 224 to the $V_{DRV}$ 218, resetting the primary winding 222. The negative current induces a negative voltage across the secondary winding 252 of the transformer 220. As a result, the base 266 of turn-off switch 256 is driven low, causing the turn-off switch 256 to change state (e.g., close). As a result the turn-off switch 256 couples the gate 272 of the primary switch 260 to the ground connection 224, causing the primary switch 260 to change state (e.g., open). In one embodiment, the first diode 214 and the second diode 216 protect the first switch 210 and the second switch 212 from excessive voltages.

As described above, the PWM current controller 206 is a UC2845 current mode PWM controller; however, in other embodiments, the input side 202 may include another type of controller (e.g., a different type of current mode controller or an average current mode controller).

Embodiments described herein provide a unipolar, isolated transistor gate drive circuit with protective clamp and reset circuit. The transistor gate drive circuit resets a primary winding of a transformer through a series of diodes which resets the transformer and protects input side switches from excessive voltage. Because the resetting of the transformer obviates the need for a DC blocking capacitor, the speed at which the transformer resets is enhanced. Moreover, the transistor gate drive withstands sudden changes in duty cycle because the resetting of the primary winding occurs fully between the turn-off mode and the turn-on mode of the transistor gate drive.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A transistor gate drive comprising:
 a first input configured to be coupled to a DC voltage source;
 a second input configured to receive a control signal;
 a third input configured to couple to a ground connection;
 a transformer having a primary winding and at least one secondary winding, the primary winding having a first end and a second end;
 a first switch having a control input and configured to couple the first input to the first end of the primary winding in response to receipt of the control signal having a first level, and to decouple the first input from the first end of the primary winding in response to the receipt of the control signal having a second level;
 a second switch having a control input and configured to couple the second end of the primary winding to the third input in response to receipt of the control signal having the first level, and to decouple the second end of the primary winding from the third input in response to the receipt of the control signal having the second level;
 a Pulse Width Modulation (PWM) controller coupled to the first switch and the second switch and configured to generate the control signal;
 a first diode coupled between the first switch and the first end of the primary winding and further coupled to the third input; and
 a second diode coupled to the first input and further coupled between the second switch and the second end of the primary winding.

2. The transistor gate drive of claim 1, wherein the first diode and the second diode are configured to provide a path for a reset of the primary winding.

3. The transistor gate drive of claim 1, wherein the first switch includes a control pin coupled to the second input, a collector coupled to the first input and an emitter coupled between the first diode and the primary winding of the transformer.

4. The transistor gate drive of claim 1, wherein the second switch is a MOSFET having a drain coupled between the primary winding and the second diode and a source coupled to the third input.

5. The transistor gate drive of claim 1, wherein the primary winding and the secondary winding have a same polarity.

6. The transistor gate drive of claim 5, further comprising at least one secondary circuit coupled to the at least one secondary winding of the transformer and having an output configured to drive a control pin of a transistor based on a level of the control signal.

7. The transistor gate drive of claim 6, wherein the at least one secondary circuit comprises:
 a turn-off switch; and
 a turn-on diode, wherein the turn-off switch and the turn-on diode are coupled in parallel with the at least one secondary winding of the transformer, and wherein a junction point between the turn-on diode and the turn-off switch are coupled to the output of the at least one secondary circuit.

8. The transistor gate drive of claim 7, further comprising a pull-down resistor coupled between the output of the at least one secondary circuit and an output ground connection.

9. The transistor gate drive of claim 1, wherein the PWM controller is configured to generate the control signal having a duty cycle of 50% or less.

10. The transistor gate drive of claim 9, wherein the duty cycle is a variable duty cycle based on input signal provided to the PWM controller.

11. A method of operating a transistor gate drive circuit, the method comprising:
    receiving a DC input voltage at a first input of the transistor gate drive circuit;
    receiving, in a turn-on mode, a control signal at a second input of the transistor gate drive circuit from a Pulse Width Modulation (PWM) controller, the control signal having a first level and a duty cycle;
    coupling, responsive to receipt of the control signal having the first level, the first input to a first end of a primary winding of a transformer;
    coupling, responsive to receipt of the control signal having the first level, a second end of the primary winding of the transformer to a ground connection;
    receiving, in a turn-off mode, the control signal at the second input of the transistor gate drive circuit, the control signal having a second level; and
    discharging, in response to the receipt of the control signal having the second level, the transformer.

12. The method of claim 11, further comprising:
    inducing, in the turn-on mode, a current in at least one secondary winding of the transformer; and
    using the current, driving at least one primary switch of at least one output circuit to turn on.

13. The method of claim 11, further comprising:
    decoupling, responsive to receipt of the control signal having the second level, the first input from the first end of the primary winding of the transformer;
    decoupling, responsive to receipt of the control signal having the second level, the second end of the primary winding of the transformer from the ground connection; and
    resetting the primary winding of the transformer through a first diode and a second diode.

14. The method of claim 13, wherein resetting includes limiting a voltage across the first switch and the second switch.

15. The method of claim 13, further comprising:
    driving, in response to resetting the primary winding, a turn-off switch to turn on;
    coupling, in response to the turn-off switch turning on, a control pin of at least one primary switch of at least one output circuit to a second ground connection; and
    driving the at least one primary switch to turn off.

16. The method of claim 11, further comprising:
    changing the duty cycle of the control signal from a first duty to a second duty cycle.

* * * * *